United States Patent
Shah et al.

(10) Patent No.: US 9,031,253 B2
(45) Date of Patent: May 12, 2015

(54) PLUG INSERTION DETECTION

(75) Inventors: Peter J. Shah, San Diego, CA (US); Arash Mehrabi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 262 days.

(21) Appl. No.: 13/433,799

(22) Filed: Mar. 29, 2012

(65) Prior Publication Data
US 2013/0156216 A1    Jun. 20, 2013

Related U.S. Application Data

(60) Provisional application No. 61/576,868, filed on Dec. 16, 2011, provisional application No. 61/576,887, filed on Dec. 16, 2011.

(51) Int. Cl.
*H04R 1/10*    (2006.01)
*H04R 5/04*    (2006.01)
*G01R 31/04*    (2006.01)

(52) U.S. Cl.
CPC ............ *H04R 5/04* (2013.01); *H04R 1/1033* (2013.01); *H04R 2420/09* (2013.01); *G01R 31/043* (2013.01); *G01R 31/041* (2013.01)

(58) Field of Classification Search
CPC .... H04R 1/1016; H04R 1/1041; H04R 5/033; H04R 5/04; H04R 2420/07
USPC .......................................................... 381/74
See application file for complete search history.

(56) References Cited

U.S. PATENT DOCUMENTS

| | | | | |
|---|---|---|---|---|
| 5,910,991 A * | 6/1999 | Farrar | ........................... | 381/59 |
| 5,917,916 A * | 6/1999 | Sibbald et al. | ................... | 381/1 |
| 6,069,960 A * | 5/2000 | Mizukami et al. | ............ | 381/74 |
| 6,122,369 A * | 9/2000 | Hwang et al. | .......... | 379/420.04 |
| 6,397,087 B1 * | 5/2002 | Kim et al. | ................. | 455/569.1 |
| 6,984,990 B2 * | 1/2006 | Shin | .............................. | 324/538 |
| 8,280,038 B2 * | 10/2012 | Johnson et al. | .............. | 379/430 |
| 8,565,444 B2 * | 10/2013 | Johnson | ........................ | 381/74 |
| 2008/0130911 A1 | 6/2008 | Tsen | | |
| 2008/0164994 A1 | 7/2008 | Johnson et al. | | |

(Continued)

FOREIGN PATENT DOCUMENTS

WO    WO-2006045617 A2    5/2006

OTHER PUBLICATIONS

Fairchild Semiconductor, "Audio Jack Detection and Configuration, MIC / GND Cross Point Switch," FSA8049, Oct. 2011, pp. 6-8.

(Continued)

*Primary Examiner* — Simon Sing

(57) ABSTRACT

Techniques for detecting full insertion of a media plug into a corresponding jack. In an exemplary embodiment, first insertion detection circuitry for detecting the presence of a load is coupled to an innermost terminal of the jack. For North American type audio plugs, the first insertion detection circuitry detects the presence of a left headphone channel coupled to the innermost terminal of the jack. Coupling the insertion detection circuitry to the innermost terminal of the jack advantageously allows detection only when the plug is fully inserted into the jack. Additional detection circuitry may be provided and coupled to the other terminals of the jack. The disclosed techniques may readily be applied to other types of media plugs, e.g., European audio plugs, video plugs, etc.

17 Claims, 4 Drawing Sheets

(56) References Cited

U.S. PATENT DOCUMENTS

| | | |
|---|---|---|
| 2009/0130910 A1 | 5/2009 | Inha et al. |
| 2010/0215183 A1 | 8/2010 | Hansson et al. |
| 2011/0099298 A1 | 4/2011 | Chadbourne et al. |
| 2011/0150234 A1 | 6/2011 | Johnson et al. |
| 2011/0216912 A1 | 9/2011 | Seo |
| 2013/0158919 A1 | 6/2013 | Shah et al. |

OTHER PUBLICATIONS

TI Application Report SLAA454—Jun. 2010 Headset Detection for TLV320AIC33 and TLV320AIC3101/4/5/6 Family, pp. 1-21.
International Search Report and Written Opinion—PCT/US2012/070191—ISA/EPO—Apr. 2, 2013.

\* cited by examiner

PLUG INSERTION DETECTION

RELATED APPLICATIONS

This application claims priority to U.S. Provisional Pat. App. Ser. No. 61/576,868, entitled "Plug Insertion Detection," filed Dec. 16, 2011, and to U.S. Provisional Pat. App. Ser. No. 61/576,887, entitled "Plug Type Detection," filed Dec. 16, 2011, both assigned to the assignee of the present disclosure, the contents of which are hereby incorporated by reference herein in their entirety.

BACKGROUND

1. Field

The disclosure relates to audio and other media devices, and, in particular, to techniques for automatically detecting insertion of a media plug into a corresponding jack.

2. Background

Audio and other media devices often include a jack for receiving a media plug coupled to a peripheral device. For example, a mobile phone may include a jack for receiving a plug coupled to an audio headset with microphone, which allows a user to carry on a voice conversation over the mobile phone using the headset. Other example media devices include MP3 players, handheld gaming devices, tablets, personal computers, notebook computers, personal digital assistants, etc., while other peripheral devices include headphones, hearing-aid devices, personal computer speakers, home entertainment stereo speakers, etc.

A media device may be configured to take different actions depending on whether the peripheral device is plugged into the jack or not. For example, an MP3 player may route an audio signal to an audio headset when the headset is plugged in, and otherwise route the audio signal to built-in speakers. In certain implementations, one or two additional mechanical pins may be provided in the jack to detect whether a plug is inserted or not. Such additional pins generally need to be routed to an appropriate chip for processing, and further increase the cost of the device in terms of material, board area, chip area, chip pin count, jack size, etc. Furthermore, the form factor of the device may be adversely affected as well.

It would be desirable to provide efficient and robust techniques for automatically enabling a device to detect insertion of a media plug into a corresponding jack.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein.

Figure 1:
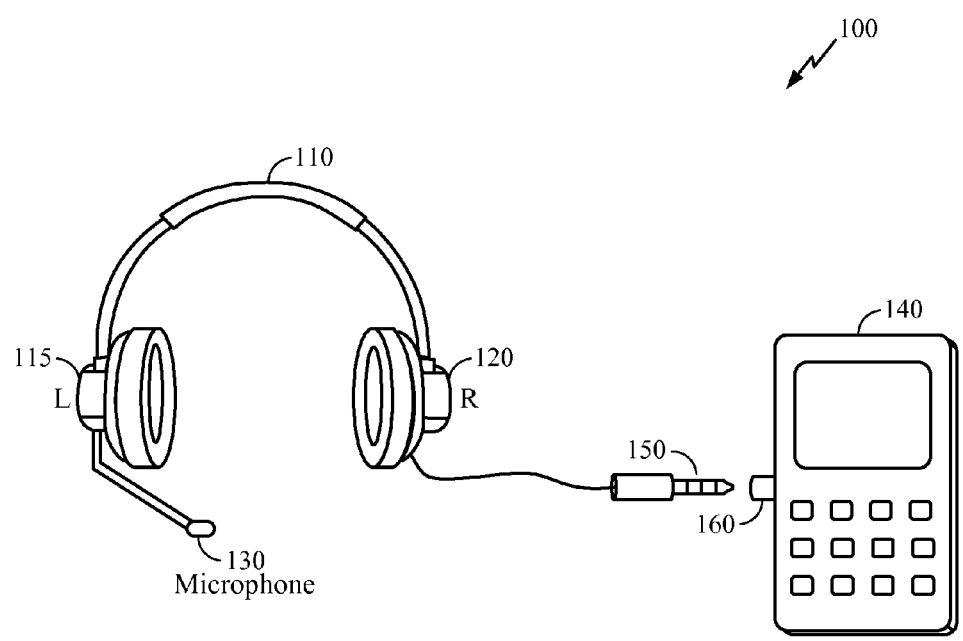
FIG. 1 illustrates an exemplary scenario wherein the techniques of the present disclosure may be applied.

FIG. 1 illustrates an exemplary scenario 100 wherein the techniques of the present disclosure may be applied. It will be appreciated that FIG. 1 is shown for illustrative purposes only, and is not meant to limit the scope of the present disclosure to the particular system shown. For example, it will be appreciated that the techniques disclosed herein may also be readily applied to audio devices other than that shown in FIG. 1. Furthermore, the techniques may also be readily adapted to other types of multi-media devices, as well as to non-audio media devices, e.g., to accommodate detection of video plug insertion into a video jack. Such alternative exemplary embodiments are contemplated to be within the scope of the present disclosure.

In FIG. 1, a headset 110 includes a left (L) headphone 115, a right (R) headphone 120, and a microphone 130. These components of the headset 110 are electrically coupled to terminals of a plug 150, which is insertable into a jack 160 of an audio device 140. Note the jack 160 need not extrude from the surface of the device 140 as suggested by FIG. 1, and furthermore, the sizes of the elements shown in FIG. 1 are generally not drawn to scale. The device 140 may be, for example, a mobile phone, MP3 player, home stereo system, etc. Audio and/or other signals may be exchanged between the device 140 and the headset 110 through the plug 150 and jack 160. The plug 150 receives the audio signals from the jack 160, and routes the signals to the L and R headphones of the headset 110. The plug 150 may further couple an electrical signal with audio content generated by the microphone 130 to the jack 160, and the microphone signal may be further processed by the device 140. Note the plug 150 may include further terminals not shown, e.g., for communicating other types of signals such as control signals, etc.

In general, the headset 110 is detachable from the device 140 by the user. In many applications, different actions may be taken by the device 140 depending on whether the headset 110 is attached to or detached from the device 140. For example, the device 140 may route an audio signal to the headset 110 when the plug 150 is plugged in, and otherwise may route the audio signal to a built-in speaker (not shown) when the plug 150 is not plugged in. Consequently, it may be desirable to provide techniques for enabling the device 140 to automatically detect when a plug 150 of a peripheral device such as the headset 110 is properly inserted into the jack 160.

Figure 2:
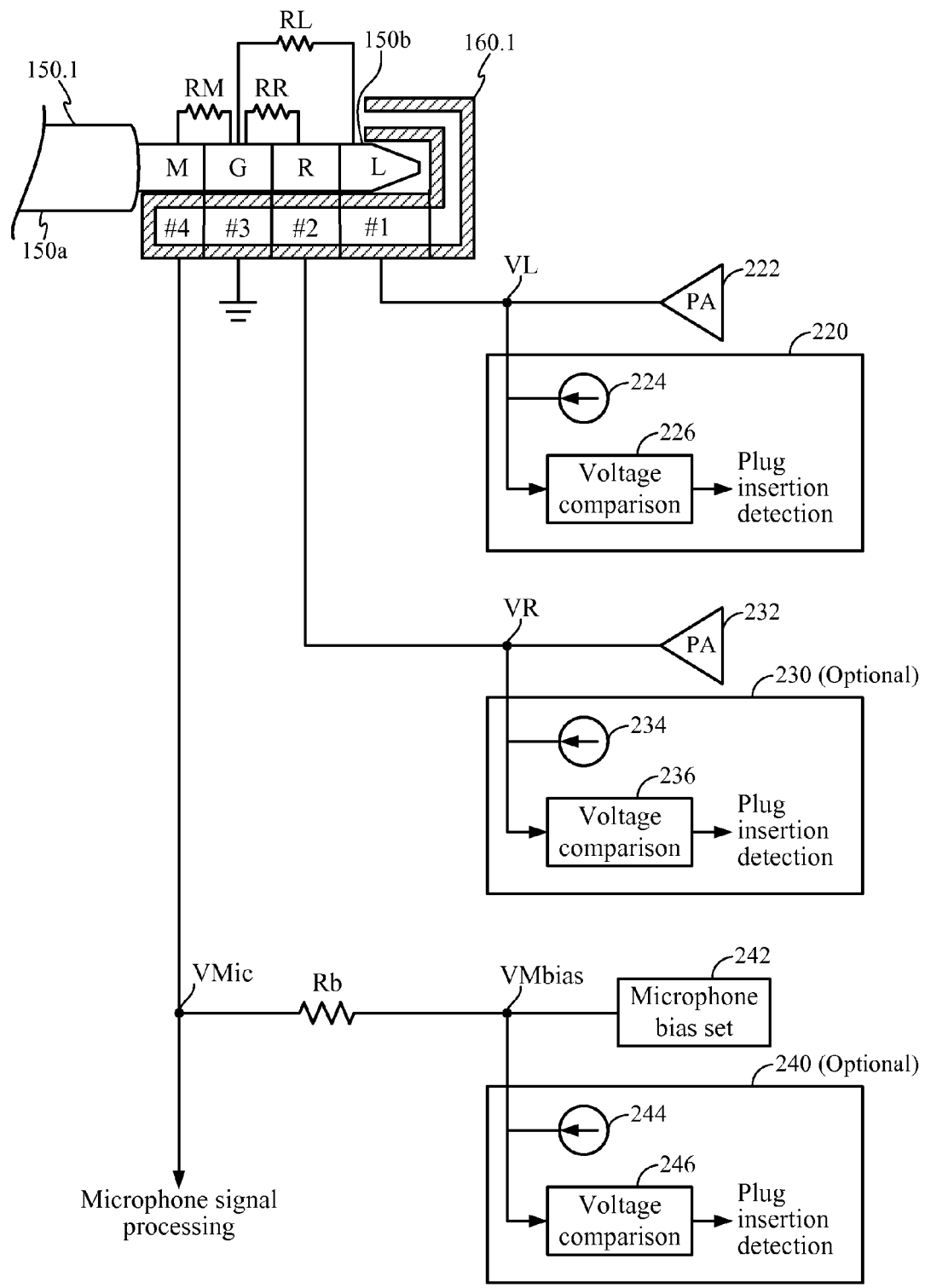
FIG. 2 illustrates an exemplary embodiment of a plug insertion detection system according to the present disclosure.

FIG. 2 illustrates an exemplary embodiment 200 of a plug insertion detection system according to the present disclosure. The plug insertion detection system 200 may be provided in the device 140 of FIG. 1, e.g., on the same integrated circuit (not shown) on which the audio processing circuitry is provided. In FIG. 2, an exemplary instance 150.1 of an audio plug 150 is shown fully inserted into a jack 160.1. The audio plug 150.1 has a particular configuration of terminals known as a North-American type configuration, wherein four terminals are provided in series from the base 150a to the tip 150b of the plug 150.1. The four terminals on the plug 150.1 are the microphone terminal (labeled "M" in FIG. 2), ground terminal ("G"), right audio channel ("R"), and left audio channel ("L"). These terminals are coupled to the corresponding components of the headset 110 as illustrated in FIG. 1, with the G terminal being coupled to a common ground connection in the headset 110 not shown in FIG. 1. Note the microphone 130 effectively presents a load resistance RM between the M and G terminals of the plug 150. Furthermore, the right headphone presents a load resistance RR between the R and G terminals of plug 150, and the left headphone presents a load resistance RL between the L and G terminals.

When the plug 150.1 is fully inserted into the jack 160.1, the terminals of the plug 150.1 become electrically engaged with corresponding terminals on the jack 160.1. In particular, jack 160.1 includes terminals #1, #2, #3, and #4, that are electrically engaged with the L, R, G, and M terminals, respectively, of the fully inserted plug 150.1 in FIG. 2. The terminals of the jack 160.1 electrically couple the terminals of the plug 150.1 to various nodes of the device 140, which processes signals to and from the headset 110.

In FIG. 2, terminal #1 of the jack 160.1 is coupled to the output of a power amplifier (PA) 222 for driving the L headphone with a voltage VL. Note the output of the PA 222 may be selectively configured to be a high impedance node if the PA 222 is not called upon to drive the L headphone, for example, when the plug 150.1 is not inserted in the jack 160.1. Further coupled to the output of the PA 222 is insertion detection circuitry 220, whose functionality is further described hereinbelow. The insertion detection circuitry 220 includes a current source 224 and a voltage comparison block 226.

In an exemplary embodiment, during an initial state, the output of the PA 222 is configured to have a high impedance. In this case, if the plug 150.1 is not fully inserted into the jack 160.1 (i.e., the contrary scenario to what is shown in FIG. 2), then the node corresponding to VL will remain at high impedance, since there is no other low-resistance path from VL to ground. In this case, the current source 224 will cause the voltage VL to be pulled to either of the voltage supply rails, depending on the directionality of the current source. For example, if current source 224 sources positive current from a high voltage supply, then VL will be pulled high. Conversely, if current source 224 sinks positive current to a low voltage supply, then VL will be pulled low. In an exemplary embodiment, the current source 224 may be configured to source or sink a very low current, e.g., on the order of microAmps, to reduce standby power consumption.

Upon full insertion of the plug 150.1 into the jack 160.1 (as shown in FIG. 2), there will be a resistance corresponding approximately to RL coupling the output of PA 222 to ground via terminal #3 of the jack 160.1. As RL is expected to be relatively low, the current source 224 will cause the voltage VL to be close to ground when the plug 150.1 is fully inserted.

In the exemplary embodiment shown, the voltage comparison block 226 compares the level of VL to a predetermined voltage level. In an exemplary embodiment, the output of block 226 may be directly used as a plug insertion detection indicator. For example, the output of block 226 may indicate no plug insertion when VL is close to the high or low voltage rail, to within a predetermined margin. In an alternative exemplary embodiment, dynamic techniques may be employed to further process the output voltage of the comparison block 226. For example, additional logic, e.g., state machine logic, may be provided to detect whether the output voltage of comparison block 226 undergoes a transition from a high voltage to a low voltage, or vice versa, to further improve robustness of the plug insertion detection mechanism. In exemplary embodiments, a digital processing module (not shown) may be further provided to process any indications of plug insertion to, e.g., alter the operation of the device 140 in response to plug insertion detection. Such alternative exemplary embodiments are contemplated to be within the scope of the present disclosure.

Note various implementations of a current source are known in the art. For example, the current source 224 may be a transistor current source, i.e., having the drain of a MOS transistor coupled to the output of the current source 224. Alternatively, the current source 224 may include a large resistance coupled to a DC voltage. Such alternative exemplary embodiments are contemplated to be within the scope of the present disclosure.

It will further be appreciated that various implementations of a voltage comparison block 226 are known in the art. For example, the block 226 may be implemented as a comparator, e.g., a Schmitt trigger. In alternative exemplary embodiments, it will be appreciated that the voltage comparison block 226 may be replaced by an inverter (not shown) having a single input coupled to the voltage VL. In this exemplary embodiment, if current source 224 sources positive current from a high voltage supply, then VL will be high when there is no load, and consequently the inverter output would be low. Conversely, the inverter output would be high when there is a load coupled to VL. In this manner, the inverter output would indicate the presence of a load at VL. Such alternative exemplary embodiments are contemplated to be within the scope of the present disclosure.

It will be appreciated that by detecting the voltage change at terminal #1 of the jack 160.1, the aforementioned techniques advantageously allow the device insertion detection block 220 to detect full plug insertion, as opposed to only partial insertion. In particular, providing the insertion detection circuitry 220 at terminal #1 of the jack 160.1 requires that the tip of the plug 150.1 be fully inserted into the jack 160.1 for the corresponding load to be detected by the circuitry 220. It will be appreciated that if the plug 150.1 were only partially inserted into the jack 160.1, e.g., such that the L terminal of the plug 150.1 instead became electrically engaged with terminal #2 of the jack 160.1 (i.e., three-quarters insertion), then the circuitry 220 coupled to the innermost terminal #1 of the jack 160.1 would not detect insertion.

For a North American type plug, the load detected by the insertion detection circuitry 220 corresponds to the left headphone, or RL, at the tip of the plug 150.1. While a North-American type configuration for the audio plug is illustratively shown in FIG. 2, it will be appreciated that the techniques of the present disclosure may be readily applied to alternative plug configurations. The techniques described herein may readily be modified by one of ordinary skill in the art to detect insertion of a plug with alternative terminals and/or an alternative sequence of terminals from that shown in FIG. 2. For example, a European type plug having an alternative sequence of terminals (i.e., ordered as G, M, R, L from the base of the plug to the tip), or an auxiliary connector (having, e.g., only G, R, and L terminals), or a video plug, etc., may be readily accommodated using the techniques of the present disclosure. In an exemplary embodiment, the insertion detection circuitry may always be provided at the innermost terminal of a jack 160, i.e., terminal #1 of jack 160.1 as shown in FIG. 2, regardless of whether insertion detection circuitry is also provided at other terminals of the jack 160.1, e.g., terminals #2, #3, #4, etc.

In an exemplary embodiment, similar techniques may be optionally applied to detect whether either (or both) of the other terminals (R or M) of the jack 160.1 is also inserted into the jack. In FIG. 2, optional insertion detection circuitry 230 and 240 are shown for detecting the presence of a load at the corresponding terminals, e.g., the impedance RR of the right headphone or RM of the microphone. In particular, insertion detection circuitry 230 may be provided to detect electrical coupling of the R terminal of the plug 150.1 to terminal #2 of the jack 160.1, in a similar manner as described for the insertion detection circuitry 220 above. Furthermore, insertion detection circuitry 240 may be provided at the output of the microphone bias set block 242, i.e., directly coupled to the output voltage VMbias of the microphone bias set block 242, to detect electrical coupling of the M terminal of the plug 150.1 to terminal #4 of the jack 160.1. In an exemplary embodiment, an indication of full plug insertion may correspond to, e.g., circuitry 220, 230, and 240 all indicating that the corresponding loads have been detected. In particular, voltage comparison blocks 226, 236, and 246 may detect that the corresponding voltages at VL, VR, and VMbias, respectively, are close to ground, prior to signaling that full plug insertion is detected.

It will be appreciated that the power amplifiers 222 and 232 may drive the left and right headphones (or speakers) with an audio signal, e.g., voice, music, etc. The inputs to the power amplifiers 222, 232 may be driven by an appropriate audio signal generator (not shown in FIG. 2). It will further be appreciated that terminal #4 of the jack 160.1 may be coupled to a microphone bias set block 242, which may generate a DC bias voltage for biasing the microphone coupled to the plug 150.1 via the bias resistor Rb. Terminal #4 may further be coupled to a microphone signal processing block (not shown) for further processing by the device 140.

Note an exemplary embodiment incorporating the insertion detection circuitry 240 may also be configured to detect when the plug 150.1 is removed from the jack. For example, during playback (e.g., when PA's 222 and 232 are actively driving the L and R terminals, respectively), the insertion detection circuitry 220, 230 may be disabled, as the outputs of PA's 222 and 232 are not configured to have high impedance. In this case, the insertion detection circuitry 240 associated with the microphone bias set 242 output can be used to detect removal, by detecting changes in VMbias as described hereinabove. It will be appreciated that during this time, the output of microphone bias set 242 may be configured to have a high impedance.

On the other hand, during recording (i.e., when the microphone is active and generating a signal voltage for the microphone signal processing block), the insertion detection circuitry 240 may be correspondingly disabled. In this case, either the insertion detection circuitry 220 or 230 may instead be used to detect removal.

It will be appreciated that an advantage of directly coupling insertion detection circuitry 240 to the output of microphone bias set 242, as opposed to using circuitry associated with the microphone signal processing, is that insertion of the plug 150.1 can be detected regardless of whether the microphone is AC- or DC-coupled to the microphone signal processing. In particular, in certain exemplary embodiments, VMic may be AC-coupled to the microphone signal processing using a coupling capacitor (not shown in FIG. 2). In such exemplary embodiments, the DC voltage content would be lost to any circuitry associated with the microphone signal processing, but would be preserved by circuitry such as insertion detection circuitry 240 coupled to the microphone bias set 242.

Figure 3:
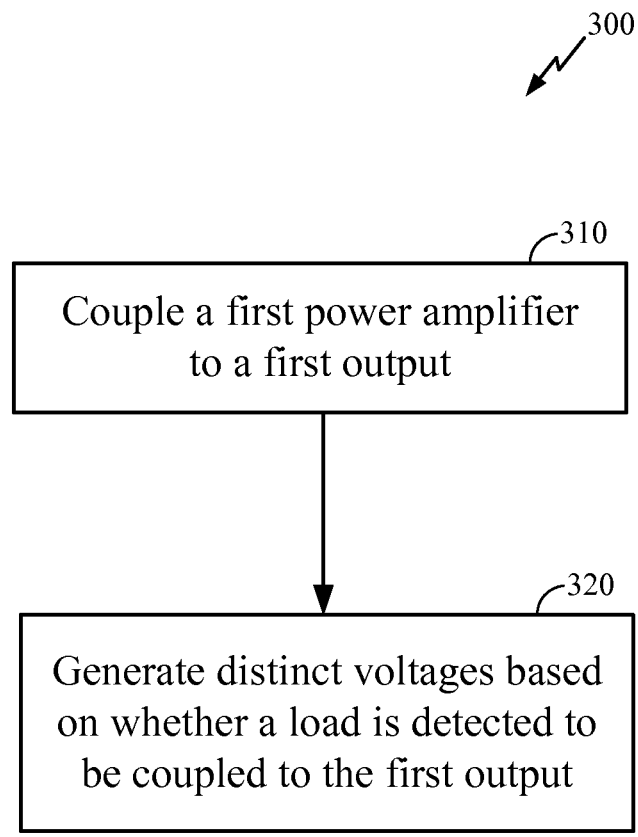
FIG. 3 illustrates an exemplary embodiment of a method according to the present disclosure.

FIG. 3 illustrates an exemplary embodiment of a method 300 according to the present disclosure. In FIG. 3, at block 310, a first power amplifier is coupled to a first output. At block 320, distinct voltages are generated based on whether a load is detected to be coupled to the first output. In an exemplary embodiment, the innermost terminal of the jack makes contact with the left headphone channel of the plug when the plug is fully inserted.

Figure 4:
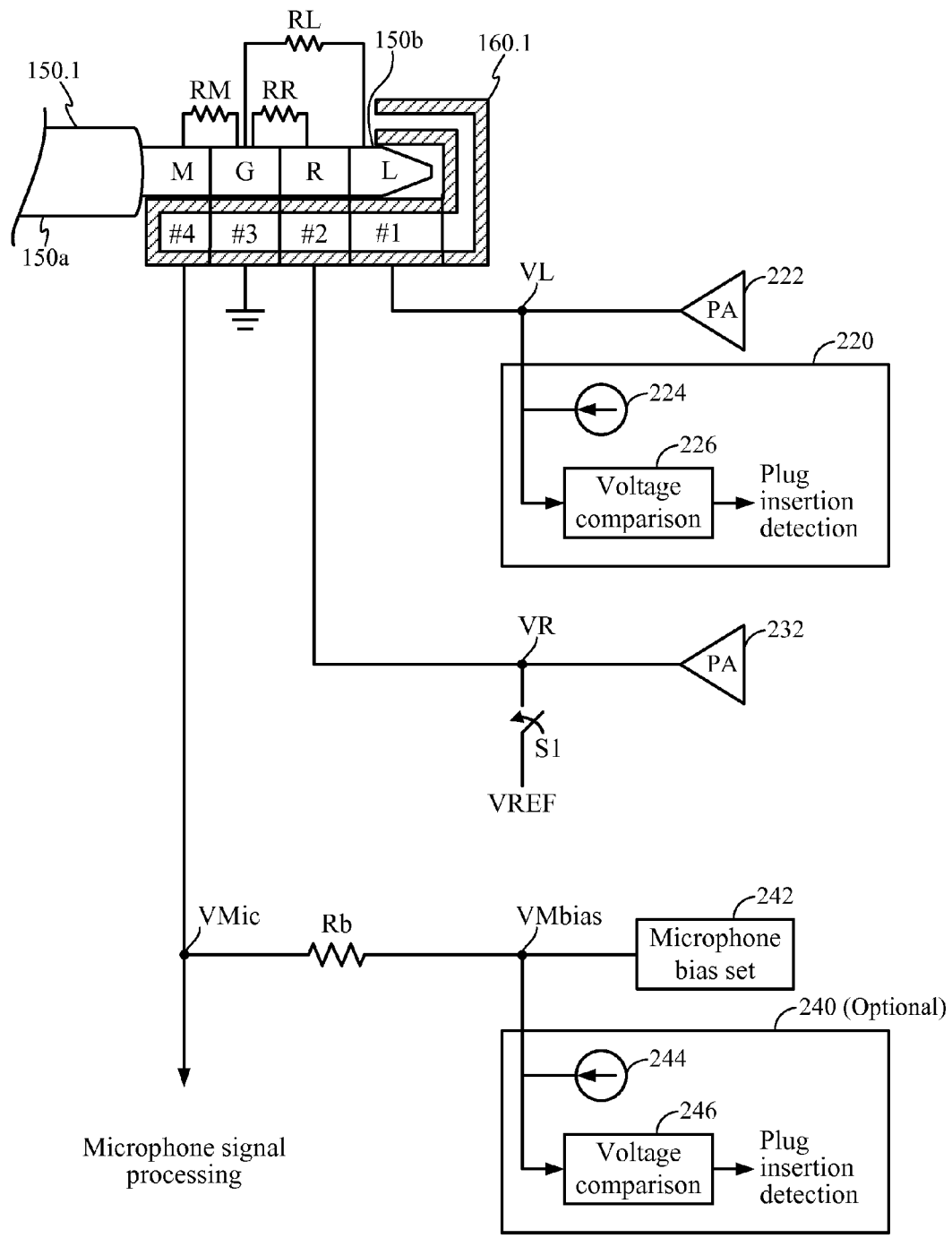
FIG. 4 illustrates an exemplary embodiment of the present disclosure wherein techniques for plug type detection are combined with the techniques for plug insertion detection described herein.

FIG. 4 illustrates an exemplary embodiment of the present disclosure wherein techniques for plug type detection are combined with the techniques for plug insertion detection described herein. Note FIG. 4 is shown for illustrative purposes only, and is not meant to limit the scope of the present disclosure. In FIG. 4, elements labeled with the same numerals as in FIG. 2 will be understood to have similar functionality, unless otherwise stated.

In FIG. 4, a switch S1 selectively couples the output of the PA 232 to a reference voltage VREF, e.g., ground. By selectively opening and closing the switch S1, and monitoring the voltage VMic to the microphone signal processing, the plug type of the inserted plug 150.1 may be determined as either North American or European. In particular, if VMic is determined to be a high voltage when S1 couples VR to ground, then the plug 150.1 may be determined to have a North American plug type. On the other hand, if VMic is determined to be a low voltage (i.e., close to ground) when S1 couples VR to ground, then the plug 150.1 may be determined to have a European plug type. Further details of the plug type detection scheme may be found in U.S. Provisional Pat. App. Ser. No. 61/576,887, entitled "Plug Type Detection," filed Dec. 16, 2011, earlier referenced herein, and in U.S. Pat. App. Ser. No. Unknown, entitled "Plug Type Detection," filed concurrently herewith, both assigned to the assignee of the present disclosure, the contents of which are hereby incorporated herein in their entirety.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
a first power amplifier having a first output for driving a first headphone;
first insertion detection circuitry configured to detect a load coupled to the first output, the insertion detection circuitry configured to generate distinct voltages based on whether a load is detected;
a jack configured to receive a media plug, the jack having a plurality of terminals, the plurality of terminals comprising an innermost terminal making contact with the plug when the plug is fully inserted, the first insertion detection circuitry being electrically coupled to the innermost terminal of the jack when the plug is fully inserted, the innermost terminal making contact with a left headphone terminal of the plug when the plug is fully inserted, a bias output further configured to be electrically coupled via a bias resistor to a microphone terminal of the plug when the plug is fully inserted;
a bias voltage generator having a bias output;
a second insertion detection circuitry configured to detect a load coupled to the bias output, bias insertion detection circuitry configured to generate distinct voltages based on whether a load is detected, wherein the detection determines if a plug inserted is a North American or European-style audio plug;
a digital processing module configured to receive the outputs of the first and second insertion detection circuitry to detect insertion of a plug into a jack;
a second power amplifier having a second output for driving a second headphone; and
a switch selectively coupling the second output to a reference voltage.

2. The apparatus of claim 1, the first insertion detection circuitry comprising:
a current source coupled to the first output;
a comparator coupled to the first output, the output of the comparator configured to generate the distinct voltages based on whether the load is detected.

3. The apparatus of claim 1, the first insertion detection circuitry comprising:
a current source coupled to the first output;
an inverter coupled to the first output, the output of the inverter configured to generate the distinct voltages based on whether the load is detected.

4. The apparatus of claim 1, the first insertion detection circuitry comprising:
a current source coupled to the first output;
a Schmitt trigger coupled to the first output, the output of the Schmitt trigger configured to generate the distinct voltages based on whether the load is detected.

5. The apparatus of claim 1, further comprising:
third insertion detection circuitry configured to detect a load coupled to the second output, the bias insertion detection circuitry configured to generate distinct voltages based on whether a load is detected.

6. The apparatus of claim 1, wherein the jack is configured to receive an audio plug comprising microphone, ground, right audio, and left audio terminals.

7. The apparatus of claim 1, wherein the jack is configured to receive a European-style audio plug.

8. The apparatus of claim 1, wherein the jack is configured to receive an audio plug comprising ground, right audio, and left audio terminals.

9. The apparatus of claim 1, the first power amplifier configurable to provide a high impedance at the first output.

10. An apparatus comprising:
a microphone bias voltage generator having a bias output coupled in series with a bias resistor;
first insertion detection circuitry directly coupled to the bias output, the first insertion detection circuitry configured to generate distinct voltages based on whether a load is coupled to the bias resistor;
a jack configured to receive a media plug, the jack having a plurality of terminals, the plurality of terminals comprising a first jack terminal making electrical contact with a microphone terminal of the plug when the plug is fully inserted, the first insertion detection circuitry being coupled to the first jack terminal and the innermost terminal making contact with a left headphone terminal of the plug when the plug is fully inserted, the bias output further configured to be electrically coupled via a bias resistor to a microphone terminal of the plug when the plug is fully inserted;
a first power amplifier having a first output for driving a first headphone;
second insertion detection circuitry configured to detect a load coupled to the first output, the insertion detection circuitry configured to generate distinct voltages based on whether a load is detected, wherein the detection determines if a plug inserted is a North American or European-style audio plug;
a bias voltage generator having a bias output;
third insertion detection circuitry configured to detect a load coupled to the bias output, the bias insertion detection circuitry configured to generate distinct voltages based on whether a load is detected;
a digital processing module configured to receive the outputs of the second and third insertion detection circuitry to detect insertion of a plug into a jack;
a second power amplifier having a second output for driving a second headphone; and
a switch selectively coupling the second output to a reference voltage.

11. The apparatus of claim 10, wherein the jack is configured to receive a North American-style audio plug.

12. An apparatus comprising:
a first power amplifier having a first output for driving an innermost terminal of a jack, wherein the first output drives a first headphone;
means for detecting insertion of a load electrically coupled to the first output wherein the detection determines if a plug inserted is a North American or European-style audio plug;
a second power amplifier having a second output wherein the second output drives a second headphone; and
a switch selectively coupling the second output to a reference voltage.

13. A method comprising:
coupling a first power amplifier to a first output for driving a first headphone; and
generating distinct voltages based on whether a load is detected to be coupled to the first output; wherein the first output is coupled to a jack configured to receive a media plug, the jack having a plurality of terminals, the plurality of terminals comprising an innermost terminal making contact with the plug when the plug is fully inserted, the first output being electrically coupled to the innermost terminal of the jack when the plug is fully inserted;
coupling a second power amplifier to a second output for driving a second headphone;
determining if the plug inserted is a North American or European-style audio plug wherein the determination affects which terminal drives a left and a right headphone; and
selectively coupling the second output to a reference voltage.

14. The method of claim 13, further comprising, upon generating a voltage corresponding to a load being detected, driving said first output using the first power amplifier.

15. The method of claim 13, further comprising:
coupling a bias current source to a second output; and
generating distinct voltages based on whether a load is detected to be coupled to the second output.

16. The method of claim 15, the innermost terminal of the jack making contact with a left headphone channel of the plug when the plug is fully inserted.

17. The method of claim 13, wherein the first output is coupled to an innermost terminal of a jack configured to receive a media plug.

* * * * *